(12) United States Patent
Liu

(10) Patent No.: US 11,302,789 B2
(45) Date of Patent: Apr. 12, 2022

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/087,431

(22) Filed: Nov. 2, 2020

(65) Prior Publication Data

US 2021/0050424 A1 Feb. 18, 2021

Related U.S. Application Data

(63) Continuation of application No. PCT/CN2019/127854, filed on Dec. 24, 2019.

(30) Foreign Application Priority Data

May 15, 2019 (CN) .......................... 201910402381.9

(51) Int. Cl.
*H01L 27/11* (2006.01)
*H01L 29/417* (2006.01)
(Continued)

(52) U.S. Cl.
CPC .... *H01L 29/41766* (2013.01); *H01L 29/0653* (2013.01); *H01L 29/401* (2013.01);
(Continued)

(58) Field of Classification Search
None
See application file for complete search history.

(56) References Cited

U.S. PATENT DOCUMENTS 10,784,267 B1\* 9/2020 Chao ................... H01L 29/7833
2005/0280085 A1\* 12/2005 Babcock ............. H01L 29/7835
257/341

(Continued)

FOREIGN PATENT DOCUMENTS

CN 103000675 3/2013
CN 103426768 A 12/2013
(Continued)

*Primary Examiner* — Ali Naraghi
(74) *Attorney, Agent, or Firm* — Kilpatrick Townsend & Stockton, LLP

(57) ABSTRACT

A semiconductor structure and a formation method thereof are provided. The semiconductor structure includes: a semiconductor substrate having a source region or drain region therein. The source region or drain region has a groove. The semiconductor structure can include a metal silicide layer arranged on a surface of a sidewall of the groove and an insulating layer arranged on a bottom surface of the groove. The edge of the insulating layer is in contact with a bottom surface of the metal silicide layer on the sidewall of the groove; and a conducting layer filled in the groove and arranged on the metal silicide layer and the insulating layer. The semiconductor structure of the present disclosure can prevent electric current from leaking into the semiconductor substrate at the bottom of the source/drain region.

15 Claims, 3 Drawing Sheets

(51) Int. Cl.
  *H01L 29/06* (2006.01)
  *H01L 29/40* (2006.01)
  *H01L 29/41* (2006.01)
  *H01L 29/08* (2006.01)
  *H01L 29/45* (2006.01)

(52) U.S. Cl.
  CPC ........ *H01L 29/413* (2013.01); *H01L 29/0847* (2013.01); *H01L 29/456* (2013.01)

(56) References Cited

U.S. PATENT DOCUMENTS

| | | |
|---|---|---|
| 2012/0313151 A1 | 12/2012 | Lee |
| 2015/0349068 A1* | 12/2015 | Levesque .......... H01L 21/28525 257/741 |
| 2016/0359040 A1* | 12/2016 | Kumar ................ H01L 29/4975 |
| 2018/0090583 A1 | 3/2018 | Choi et al. |

FOREIGN PATENT DOCUMENTS

| | | |
|---|---|---|
| CN | 209045566 U | 6/2019 |
| CN | 210092094 U | 2/2020 |

\* cited by examiner

SEMICONDUCTOR STRUCTURE AND FORMATION METHOD THEREOF

CROSS REFERENCE

The present disclosure is a continuation of PCT/CN2019/127854, filed on Dec. 24, 2019, which claims priority to Chinese Patent Application No. 201910402381.9, titled "SEMICONDUCTOR STRUCTURE AND FORMATION METHOD THEREOF" and filed on May 15, 2019, the entire contents of which are incorporated herein by reference.

TECHNICAL FIELD

The present disclosure relates to the field of semiconductors, and more particularly, to a semiconductor structure and a formation method thereof.

BACKGROUND

At present, in fabrication processes of semiconductors, forming a contact structure on a dielectric layer to implement electrical connection between semiconductor devices is a widely used technology. The contact structure may be directly and electrically connected to a gate and a source/drain of a transistor, or may also be used for electrical connection between layers. In order to reduce contact resistance of the electrical connection between the contact structure and the gate and the source/drain of the transistor, generally a metal silicide layer may be formed on the surface of the gate and the source/drain of the contact structure to be formed through metal deposition and rapid annealing.

An existing process of forming the contact structure includes following steps. A semiconductor substrate is provided, wherein a gate structure is formed in the semiconductor substrate, and a source/drain region is formed in the semiconductor substrate on two sides of the gate structure. A cobalt metal layer is deposited on a surface of the gate structure, a surface of the source/drain region, and a surface of the semiconductor substrate. Rapid thermal annealing is performed such that the cobalt metal layer reacts with silicon in the gate structure and the source/drain region to form a metal silicide. Unreacted metal is removed. An interlayer dielectric layer is formed on a surface of the metal silicide and the surface of the gate structure. The interlayer dielectric layer is etched to form, in the dielectric layer, a contact hole exposed from the surface of the metal silicide. Metal is filled in the contact hole to form a metal plug.

However, there still exists leakage current between the semiconductor substrate and an existing connection structure such as the metal plug and the metal silicide layer.

SUMMARY

One technical problem solved in accordance with various embodiments is how to reduce leakage current between a semiconductor substrate and a connection structure such as a metal plug and a metal silicide layer.

Various embodiments provide a semiconductor structure, which includes:

a semiconductor substrate having a source region or drain region therein, the source region or drain region having a groove;

a metal silicide layer arranged on a surface of a sidewall of the groove;

an insulating layer arranged on a bottom surface of the groove, an edge of the insulating layer being in contact with a bottom surface of the metal silicide layer on the sidewall of the groove; and a conducting layer filled in the groove and arranged on the metal silicide layer and the insulating layer.

In some embodiments, the contact structure further includes a buffer layer, and the buffer layer covers the insulating layer and correspondingly covers the metal silicide layer on the sidewall of the groove.

In some embodiments, the buffer layer includes a titanium nitride layer and a titanium layer arranged on the titanium nitride layer, or includes a tantalum nitride layer and a tantalum layer arranged on the tantalum nitride layer, or includes a gallium layer and a gallium nitride layer arranged on the gallium layer.

In some embodiments, a material of the metal silicide layer includes one or more of cobalt silicide, nickel silicide, platinum silicide, tantalum silicide, molybdenum silicide, and titanium silicide.

In some embodiments, a material of the insulating layer includes one or more of cobalt oxide, nickel oxide, platinum oxide, tantalum oxide, molybdenum oxide, and titanium oxide.

In some embodiments, the metal silicide layer has a thickness of 10-50 nm, and the insulating layer has a thickness of 1-2 nm. Alternatively, a gate structure is formed on the semiconductor substrate, and the source region or drain region is respectively arranged in the semiconductor substrate on two sides of the gate structure.

In some embodiments, the semiconductor substrate further has a dielectric layer, and in the dielectric layer there is provided with a metal plug connected to the contact structure.

Various embodiments provide a method for forming a semiconductor structure, which includes:

providing a semiconductor substrate having a source region or drain region;

forming a groove in the source region or drain region;

forming a metal silicide layer on a surface of a sidewall of the groove;

forming an insulating layer on a bottom surface of the groove; and forming a conducting layer on the insulating layer, the conducting layer being filled in the groove.

In some embodiments, a buffer layer is formed on the insulating layer before forming the conducting layer.

In some embodiments, a dielectric layer is formed on the semiconductor substrate before forming the metal silicide layer in the source region or drain region, wherein the dielectric layer has a through hole exposed from a surface of the source region or drain region. A groove is formed in the source region or drain region at a bottom of the through hole, and the metal silicide layer is formed on the sidewall of the groove.

In some embodiments, a dielectric layer covering the metal silicide layer, the conducting layer and the semiconductor substrate is formed after forming the conducting layer, and a metal plug is formed in the dielectric layer, wherein the metal plug is connected to the conducting layer.

In some embodiments, a material of the insulating layer includes one or more of cobalt oxide, nickel oxide, platinum oxide, tantalum oxide, molybdenum oxide, and titanium oxide.

In some embodiments, the metal silicide layer has a thickness of 10-50 nm, and the insulating layer has a thickness of 1-2 nm. Alternatively, a gate structure is formed on the semiconductor substrate, and the source region or drain region is respectively formed in the semiconductor substrate on two sides of the gate structure.

Compared with the existing technologies, various embodiments have following advantages.

In the semiconductor structure in accordance with various embodiments, a metal silicide layer is formed on a sidewall of a groove to reduce a contact resistance, and an insulating layer is formed on the bottom of the groove, such that when electric current is transmitted downward from a conducting layer, the insulating layer may form a barrier. Therefore, the electric current may be blocked by the insulating layer in a vertical direction, and can only flow to a direction toward the sidewall of the groove, rather than vertically leak into a semiconductor substrate at the bottom of the insulating layer. In this way, an impact of the electric current on the source region or drain region is reduced, and a probability of occurrence of device defects is reduced.

In particular, the source region or drain region of a planar-type field effect transistor is arranged transversely. Therefore, when the electric current transversely flows from the conducting layer to the source region or drain region, it is easier to implement conduction of the electric current between the source region and the drain region, and the leakage current from the source region to the semiconductor substrate or the leakage current from the drain region to the semiconductor substrate can be reduced, and thus a conduction performance of the field effect transistor can be effectively improved.

DETAILED DESCRIPTION

As stated in the Background section, there still exists leakage current between the semiconductor substrate and an existing connection structure such as the metal plug (contact structure) and the metal silicide layer.

Studies have found that when an existing transistor is in operation, the vast majority of electric current flows from a drain to a source through a channel, but there is also a small amount of the electric current flowing from the drain to the substrate, which causes leakage current.

For this reason, various embodiments provide a semiconductor structure and a formation method thereof. In the semiconductor structure, a metal silicide layer is formed on a sidewall of a groove to reduce a contact resistance, and an insulating layer is formed on the bottom of the groove, such that when electric current is transmitted downward from a conducting layer, the insulating layer may form a barrier. Therefore, the electric current may be blocked by the insulating layer in a vertical direction, and can only flow to a direction toward the sidewall of the groove, rather than vertically leak into a semiconductor substrate at the bottom of the insulating layer. In this way, an impact of the electric current on a source region or drain region is reduced, and a probability of occurrence of device defects is reduced.

To make the foregoing objectives, features, and advantages of the present disclosure more apparent and lucid, various embodiments are described in detail below with reference to the accompanying drawings. When describing the embodiments herein, for the convenience of description, a schematic diagram may be partially enlarged not according to a general scale, and the schematic diagram is only an example, and should not limit the protection scope of the present disclosure herein. In addition, three-dimensional dimensions (length, width and depth) should be included in actual production.

Figure 1:
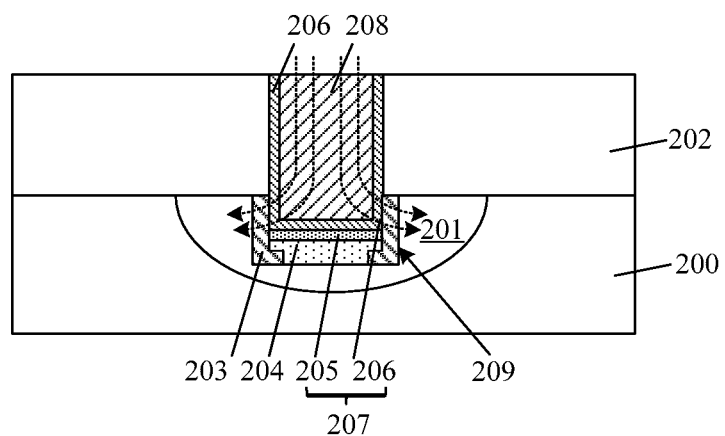
FIG. 1 is a schematic structural diagram of a semiconductor structure according to an embodiment of the present disclosure.

FIG. 1 is a schematic structural diagram of a semiconductor structure according to one embodiment.

Referring to FIG. 1, the semiconductor structure of this embodiment includes:

a semiconductor substrate 200 having a source region or drain region 201 therein, the source region or drain region 201 having a groove 209;

a metal silicide layer 203 arranged on a surface of a sidewall of the groove 209;

an insulating layer 204 arranged on a bottom surface of the groove 209, wherein an edge of the insulating layer 204 is in contact with a bottom surface of the metal silicide layer 203 on the sidewall of the groove 209; and a conducting layer 208 filled in the groove 209 and arranged on the metal silicide layer 203 and the insulating layer 204.

In some embodiments, a material of the semiconductor substrate 200 may be silicon (Si), germanium (Ge), or silicon germanium (GeSi), silicon carbide (SiC). Moreover, a material of the semiconductor substrate 200 may be silicon on insulator (SOI) or germanium on insulator (GOO. Furthermore, the material of the semiconductor substrate 200 may be other materials, for example, III-V compounds such as gallium arsenide. The semiconductor substrate 200 in this embodiment is a silicon semiconductor substrate.

The semiconductor substrate 200 has active regions (not shown in the figure) and trench isolation structures (not shown in the figure) for isolating the active regions. A semiconductor device (not shown in the figure) may be formed on the active region of the semiconductor substrate 200, and the semiconductor device includes a transistor.

In an embodiment, the transistor includes a gate structure arranged on the surface of the semiconductor substrate 200 and the source region or drain region 201 arranged in the semiconductor substrate on two sides of the gate structure. The gate structure may include a gate dielectric layer arranged on the surface of the semiconductor substrate 200, a gate electrode arranged on the gate dielectric layer, and a side wall positioned on sidewall surfaces of the gate electrode and the gate dielectric layer. The source region or drain region 201 is doped with impurity ions.

The metal silicide layer 203 is arranged on the sidewall of the groove 209, and the metal silicide layer 203 is shaped like a hollow ring. The metal silicide layer 203 can reduce a contact resistance between the conducting layer or a conducting plug and the source region or drain region 201. However, the metal silicide layer 203 has a certain junction leakage current. A material of the metal silicide layer 203 includes one or more of cobalt silicide, nickel silicide, platinum silicide, tantalum silicide, molybdenum silicide, and titanium silicide. In an embodiment, the metal silicide layer 203 has a thickness of 10-50 nm.

In this embodiment, the metal silicide layer 203 is formed on the sidewall of the groove 209 to reduce the contact resistance, and the insulating layer 204 is formed on the bottom of the groove 209, such that when electric current is transmitted downward from the conducting layer 208, the insulating layer 204 may form a barrier. Therefore, the electric current may be blocked by the insulating layer 204 in a vertical direction, and can only flow to a direction (the direction of arrow as shown in FIG. 1) toward the sidewall of the groove 209, rather than vertically leak into the semiconductor substrate 200 at the bottom of the insulating layer 204. In this way, the impact of the electric current on the source region or drain region 201 is reduced, and the probability of occurrence of device defects is reduced.

In particular, the source region or drain region 201 of a planar-type field effect transistor is arranged transversely. Therefore, when the electric current transversely flows from the conducting layer 208 to the source region or drain region, it is easier to implement conduction of the electric current between the source region and the drain region, and the leakage current from the source region to the semiconductor substrate 200 or the leakage current from the drain region to the semiconductor substrate 200 can be reduced, and thus the conduction performance of the field effect transistor can be effectively improved.

A material of the insulating layer 204 is a non-conducting insulating material. In an embodiment, the material of the insulating layer 204 is one or more of cobalt oxide, nickel oxide, platinum oxide, tantalum oxide, molybdenum oxide, and titanium oxide. The insulating layer 204 has a thickness of 1-2 nm. When the electric current is transmitted downward from the conducting layer 208, the insulating layer can better block the electric current. In an embodiment, the insulating layer 204 has the same metallic elements as the metal silicide layer 203 to simplify the manufacturing process. For example, when the material of the metal silicide layer 203 is cobalt silicide, the material of the insulating layer 204 is cobalt oxide.

The contact structure further includes a buffer layer 207, and the buffer layer 207 covers the insulating layer 204 and correspondingly covers the metal silicide layer 203 on the sidewall of the groove 209. The buffer layer 207 plays a role in blocking metal diffusion of the conducting layer 208, buffering a stress, and matching an adhesion force between film layers. The buffer layer 207 may include a titanium nitride layer and a titanium layer arranged on the titanium nitride layer, or include a tantalum nitride layer and a tantalum layer arranged on the tantalum nitride layer, or include a gallium layer and a gallium nitride layer arranged on the gallium layer. In this embodiment, the buffer layer 207 includes a titanium nitride layer 205 and a titanium layer 206 arranged on the titanium nitride layer 205. The titanium nitride layer 205 has a thickness of 2-4 nm, and the titanium layer 206 has a thickness of 2-4 nm.

The conducting layer 208 fills the groove, and the material of the conducting layer 45 may be a conducting material such as copper or tungsten.

In this embodiment, the semiconductor substrate 200 further has a dielectric layer 202. The dielectric layer 202 has a through hole exposed from a partial surface of the source region or drain region 201, a position of the through hole is corresponding to that of the groove 209, and the conducting layer 208 extends upward to fill the through hole. The buffer layer 207 may also cover a sidewall of the through hole.

In another embodiment in accordance with the disclosure, the semiconductor substrate 200 may have a dielectric layer similar to the dielectric layer 202 shown in this embodiment. Similarly, the dielectric layer 202 in that embodiment may have a through hole exposed from a partial surface of the source region or drain region 201, and a conducting plug is formed in the through hole. The conducting plug is arranged above the conducting layer 208, and the conducting plug is electrically connected to the conducting layer.

In some embodiments as in this embodiment, the dielectric layer 202 may be a single-layered or multi-layered stack structure, silicon oxide, silicon nitride, silicon oxynitride, fluorine-doped silicon dioxide (FSG), boron-doped silicon dioxide (BSG), phosphorus-doped silicon dioxide (PSG) or boron-phosphorus-doped silicon dioxide (BPSG), low-K materials, other suitable materials and/or combinations of the above materials.

The formation process of the semiconductor structure of the present disclosure is described in detail below with reference to the accompanying drawings. FIG. 2-FIG. 8 are schematic structural diagrams showing a formation process of the semiconductor structure according to an embodiment of the present disclosure.

Figure 2:
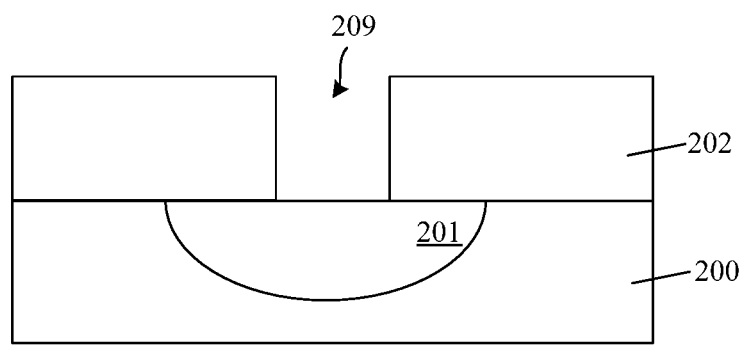
FIG. 2-FIG. 8 are schematic structural diagrams showing a formation process of the semiconductor structure according to an embodiment of the present disclosure.

Referring to FIG. 2, a semiconductor substrate 200 having a source region or drain region 201 is provided.

The semiconductor substrate 200 has active regions (not shown in the figure) and trench isolation structures (not shown in the figure) for isolating the active regions. A semiconductor device (not shown in the figure) may be formed on the active region of the semiconductor substrate 200, and the semiconductor device includes a transistor.

In an embodiment, the source region or drain region 201 is a source/drain region of the transistor, a gate structure (not shown in the figure) is also formed on the semiconductor substrate 200, and the source region or drain region 201 is respectively arranged in the semiconductor substrate 200 on two sides of the gate structure. The gate structure may include a gate dielectric layer arranged on the surface of the semiconductor substrate 200, a gate electrode arranged on the gate dielectric layer, and a side wall positioned on sidewall surfaces of the gate electrode and the gate dielectric layer. A material of the gate dielectric layer may be silicon oxide or a high-K dielectric material, and a material of the gate electrode may be polysilicon or metal.

In this embodiment, a dielectric layer 202 may be formed on the semiconductor substrate 200, and the dielectric layer 202 has a through hole 209 exposed from a partial surface of the source region or drain region 201. In an embodiment, the through hole 209 is formed in the dielectric layer by using an etching process.

In other implementations, the dielectric layer 202 may not be formed on the semiconductor substrate 200, and subsequently the source region or drain region 201 is directly etched to form the groove in the source region or drain region 201.

Figure 3:
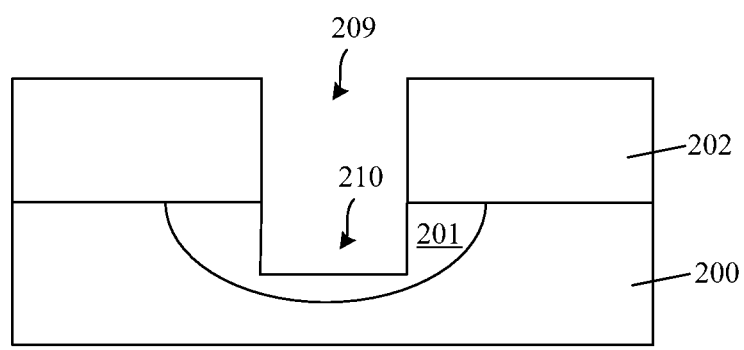

Referring to FIG. 3, the groove 210 is formed in the source region or drain region 201.

In accordance with various embodiments, an objective of forming the groove 210 is to facilitate the subsequent formation of the metal silicide layer on the sidewall of the groove 210 and the formation of the insulating layer at the bottom of the groove, and the formed metal silicide layer has a certain height. Subsequently, the insulating layer is formed at the bottom of the groove and the conducting layer is formed on the insulating layer. In this way, it is ensured that the electric current of the conducting layer can flow to the corresponding source region or drain region through the metal silicide layer without having a negative effect on the conduction between the source region and the drain region.

In this embodiment, the source region or drain region 201 at the bottom of the through hole 209 is etched along the through hole 209 in the dielectric layer 202, and the groove 210 is formed in the source region or drain region 201, and the source region or drain region 201 may be etched by using wet and dry etching processes. The width of the formed groove 210 is smaller than that of the source region (or drain region) 201, and the depth of the groove 210 is smaller than that of the source region (or drain region) 201.

In some embodiments, when no dielectric layer is formed on the semiconductor substrate 200, a patterned mask layer may be formed on the semiconductor substrate, wherein the patterned mask layer has an opening exposed from the partial surface of the source region or drain region 201. The source region or drain region 201 is etched by using the patterned mask layer as a mask, and the groove is formed in the source region or drain region 201.

The number of the groove 210 in the source region or drain region 201 may be at least one (more than or equal to two).

Figure 4:
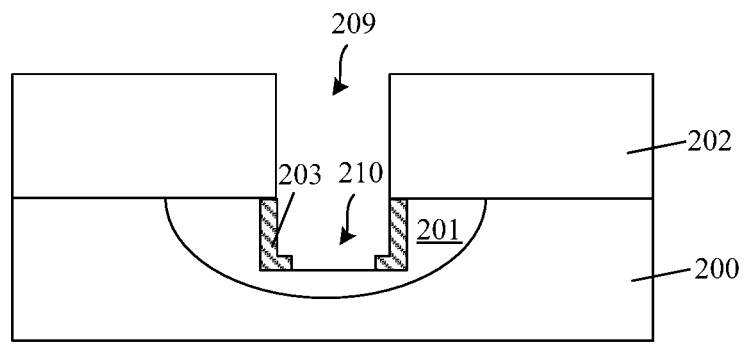

Referring to FIG. 4, the metal silicide layer 203 is formed on the surface of the sidewall of the groove 210.

A material of the insulating layer 204 is a non-conducting insulating material. In an embodiment, the material of the insulating layer 204 is one or more of cobalt oxide, nickel oxide, platinum oxide, tantalum oxide, molybdenum oxide, and titanium oxide. The insulating layer 204 has a thickness of 1-2 nm. When the electric current is transmitted downward from the conducting layer 208, the insulating layer can better block the electric current. In an embodiment, the insulating layer 204 has the same metallic elements as the metal silicide layer 203 to simplify the manufacturing process. For example, when the material of the metal silicide layer 203 is cobalt silicide, the material of the insulating layer 204 is cobalt oxide.

In an embodiment, the formation process of the metal silicide layer 201 is as below. A metal layer (not shown in the figure) is formed on the sidewall and the bottom surface of the groove 210, the sidewall and the bottom surface of the through hole 209, and the surface of the dielectric layer 202. The material of the metal layer is one or more of cobalt, nickel, platinum, tantalum, molybdenum, and titanium. Next, the rapid thermal annealing is performed, such that the metal in the metal layer reacts with silicon in the source region or drain region 201 to form the metal silicide layer. Next, the unreacted metal layer on the sidewall of the through hole 209 and the surface of the dielectric layer 202 is removed, wherein the unreacted metal layer may be removed by wet etching. Next, the metal silicide layer at the bottom of the groove 210 is removed by etching, and the metal silicide layer 203 is formed on the surface of the sidewall of the groove 210, wherein the metal silicide layer at the bottom of the groove 210 may be removed by using an anisotropic dry etching process.

Figure 5:
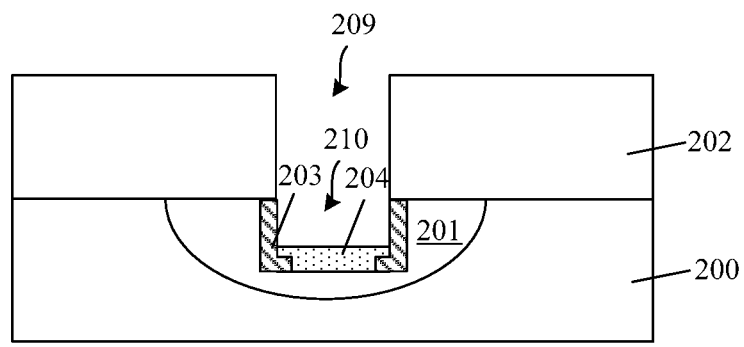

Referring to FIG. 5, the insulating layer 204 is formed on the bottom surface of the groove 209.

In an embodiment, the formation process of the insulating layer 204 is as below. An insulating material layer is formed on the sidewall and the bottom surface of the groove 210, the sidewall surface of the through hole 209, and the surface of the dielectric layer 202. The insulating material layer is formed by using a deposition process. Next, the insulating material layer on the sidewall surface of the groove 210, the sidewall surface of the through hole 209, and the surface of the dielectric layer 202 is removed by etching, and the insulating layer 204 is formed on the bottom surface of the groove 210, wherein an edge of the insulating layer 204 is in contact with the bottom surface of the metal silicide layer 201 on the sidewall of the groove 210.

A material of the insulating layer 204 is a non-conducting insulating material. In an embodiment, the material of the insulating layer 204 is one or more of cobalt oxide, nickel oxide, platinum oxide, tantalum oxide, molybdenum oxide, and titanium oxide. The insulating layer 204 has a thickness of 1-2 nm. When the electric current is transmitted downward from the conducting layer 208, the insulating layer can better block the electric current. In an embodiment, the insulating layer 204 has the same metallic elements as the metal silicide layer 203 to simplify the manufacturing process. For example, when the material of the metal silicide layer 203 is cobalt silicide, the material of the insulating layer 204 is cobalt oxide.

Figure 6:
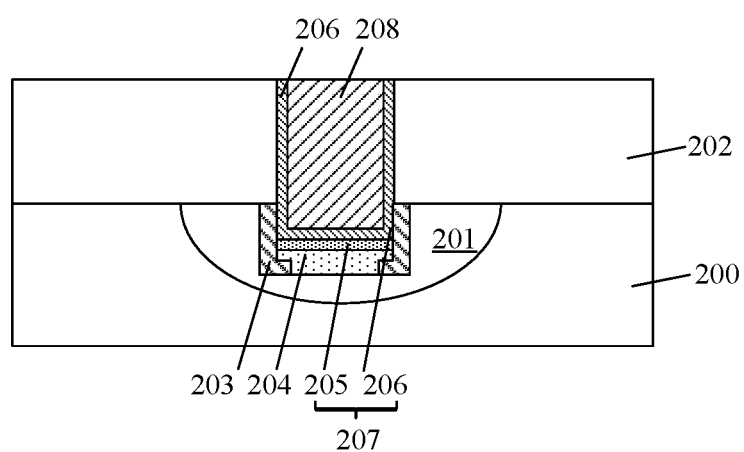

Referring to FIG. 6, a conducting layer 208 is formed on the insulating layer 204, and the conducting layer 208 fills the groove.

In this embodiment, the conducting layer 208 not only fills the groove 210 (referring to FIG. 5), but also fills the through hole 209 (referring to FIG. 5).

In other embodiments, when the dielectric layer 202 is not formed on the semiconductor substrate 200, the conducting layer 208 may only fill the groove 210 (referring to FIG. 5).

The material of the conducting layer 208 may be Cu, Al, W or other conducting materials.

In an embodiment, a buffer layer 207 is formed on the insulating layer 204 before forming the conducting layer 208.

The buffer layer 207 may include a titanium nitride layer and a titanium layer arranged on the titanium nitride layer, or include a tantalum nitride layer and a tantalum layer arranged on the tantalum nitride layer, or include a gallium layer and a gallium nitride layer arranged on the gallium layer. In this embodiment, the buffer layer 207 includes a titanium nitride layer 205 and a titanium layer 206 arranged on the titanium nitride layer 205. The titanium nitride layer 205 has a thickness of 2-4 nm, and the titanium layer 206 has a thickness of 2-4 nm.

The buffer layer 207 may also cover the sidewall surface of the through hole in addition to covering the sidewall surface of the groove.

Figure 7:
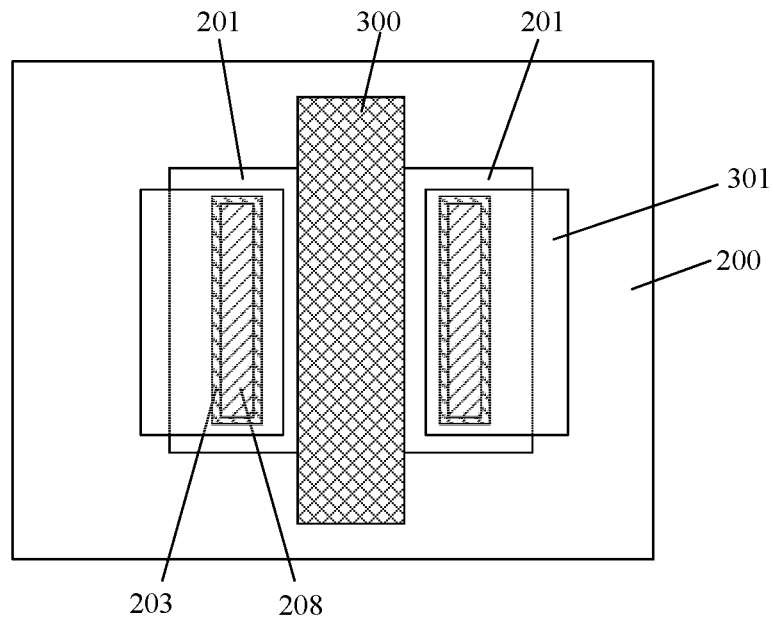

Referring to FIG. 7, FIG. 7 is a schematic structural diagram showing a vertical view of the semiconductor structure as shown in FIG. 6 after the conducting layer 208 is formed in an embodiment, wherein neither the dielectric layer 202 nor the buffer layer 207 is shown in FIG. 7. As shown in FIG. 7, the source region or drain region 201 is respectively arranged in the semiconductor substrate on two sides of the gate structure 300. The source region or drain region 201 has a groove, and on the sidewall of the groove there is provided with the metal silicide layer 203. An insulating layer 204 is arranged at the bottom of the groove (referring to FIG. 6), the conducting layer 208 is arranged on the insulating layer 204, and the conducting layer 208 fills the groove.

In an embodiment, referring to FIG. 7, FIG. 7 is a schematic structural diagram showing a vertical view of the semiconductor structure as shown in FIG. 6 after the conducting layer 208 is formed in an embodiment, wherein neither the dielectric layer 202 nor the buffer layer 207 is shown in FIG. 7. As shown in FIG. 7, the source region or drain region 201 is respectively arranged in the semiconductor substrate on two sides of the gate structure 300. The source region or drain region 201 has a groove, and on the sidewall of the groove there is provided with the metal silicide layer 203. An insulating layer 204 is arranged at the bottom of the groove (referring to FIG. 6), the conducting layer 208 is arranged on the insulating layer 204, and the conducting layer 208 fills the groove. Subsequently, a metal layer 301 electrically connected to the conducting layer 208 may be formed on the conducting layer 208.

Figure 8:
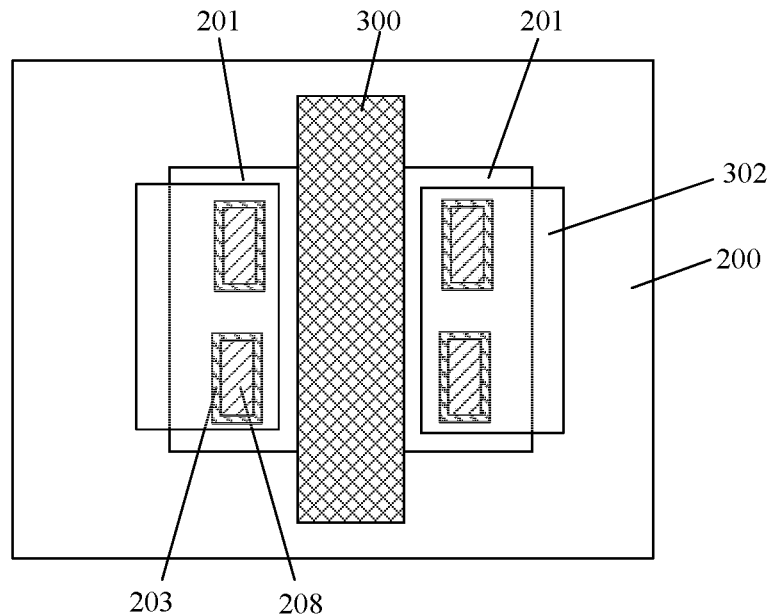

In another embodiment, referring to FIG. 8, FIG. 8 is a schematic structural diagram showing a vertical view of the semiconductor structure as shown in FIG. 6 after the conducting layer 208 is formed, wherein neither the dielectric layer 202 nor the buffer layer 207 is shown in FIG. 8. As shown in FIG. 8, the source region or drain region 201 is respectively arranged in the semiconductor substrate on two sides of the gate structure 300, and the source region or drain region 201 has a plurality of grooves. Reference is made by taking an example where the source region or drain region 201 has two grooves, wherein on the sidewall of each of the grooves there is provided with the metal silicide layer 203. An insulating layer 204 is arranged at the bottom of each of the grooves (referring to FIG. 6), the conducting layer 208 is arranged on the insulating layer 204, and the conducting layer 208 fills the grooves. Subsequently, a metal layer 302 electrically connected to a plurality of conducting layers 208 on the source region or drain region 201 may be formed on the conducting layer 208.

While the present disclosure has been made by way of embodiments, the embodiments herein are not intended to be limiting. Those skilled in the art should understand that, possible change and modification may be made on the technical solution of the present disclosure, without departing from the spirit and scope of the present disclosure, by using the methods and technical contents disclosed above. Therefore, any simple modifications, equivalent changes and improvements of the above embodiments, which are not departing from the content of the technical solution of the present disclosure, according to the technical concept of the present disclosure, are all within the scope of protection of the technical solution of the present disclosure.

What claimed is:

1. A semiconductor structure, comprising: a semiconductor substrate having a source region or drain region therein, the source region or drain region having a groove; a metal silicide layer arranged on a surface of a sidewall of the groove; an insulating layer arranged directly on a bottom surface of the groove, an edge of the insulating layer being in contact with a bottom surface of the metal silicide layer on the sidewall of the groove; and a conducting layer filled in the groove and arranged on the metal silicide layer and the insulating layer.

2. The semiconductor structure according to claim 1, wherein the contact structure further comprises a buffer layer, the buffer layer covering the insulating layer and covering the metal silicide layer on the sidewall of the groove.

3. The semiconductor structure according to claim 2, wherein the buffer layer comprises
   a titanium nitride layer and a titanium layer arranged on the titanium nitride layer,
   a tantalum nitride layer and a tantalum layer arranged on the tantalum nitride layer, or
   a gallium layer and a gallium nitride layer arranged on the gallium layer.

4. The semiconductor structure according to claim 1, wherein a material of the metal silicide layer comprises one or more of cobalt silicide, nickel silicide, platinum silicide, tantalum silicide, molybdenum silicide, or titanium silicide.

5. The semiconductor structure according to claim 1, wherein a material of the insulating layer comprises one or more of cobalt oxide, nickel oxide, platinum oxide, tantalum oxide, molybdenum oxide, or titanium oxide.

6. The semiconductor structure according to claim 1, wherein the metal silicide layer has a thickness of 10-50 nanometer, and the insulating layer has a thickness of 1-2 nanometer.

7. The semiconductor structure according to claim 1, wherein a gate structure is formed on the semiconductor substrate, and the source region or drain region is respectively arranged in the semiconductor substrate on two sides of the gate structure.

8. The semiconductor structure according to claim 1, wherein the semiconductor substrate further has a dielectric layer, and in the dielectric layer there is provided with a metal plug connected to the contact structure.

9. A method for forming a semiconductor structure, comprising: providing a semiconductor substrate having a source region or drain region; forming a groove in the source region or drain region; forming a metal silicide layer on a surface of a sidewall of the groove; forming an insulating layer directly on a bottom surface of the groove; and forming a conducting layer on the insulating layer, the conducting layer being filled in the groove.

10. The method for forming a semiconductor structure according to claim 9, wherein a buffer layer is formed on the insulating layer before forming the conducting layer.

11. The method for forming a semiconductor structure according to claim 9, wherein
    a dielectric layer is formed on the semiconductor substrate before forming the metal silicide layer in the source region or drain region, and the dielectric layer has a through hole exposed from a surface of the source region or drain region; and
    a groove is formed in the source region or drain region at a bottom of the through hole; and the metal silicide layer is formed on the sidewall of the groove.

12. The method for forming a semiconductor structure according to claim 9, wherein a dielectric layer covering the metal silicide layer, the conducting layer and the semiconductor substrate is formed after forming the conducting layer; and a metal plug is formed in the dielectric layer, wherein the metal plug is connected to the conducting layer.

13. The method for forming a semiconductor structure according to claim 9, wherein a material of the insulating layer comprises one or more of cobalt oxide, nickel oxide, platinum oxide, tantalum oxide, molybdenum oxide, or titanium oxide.

14. The method for forming a semiconductor structure according to claim 9, wherein the metal silicide layer has a thickness of 10-50 nanometer, and the insulating layer has a thickness of 1-2 nanometer.

15. The method for forming a semiconductor structure according to claim 9, wherein a gate structure is formed on the semiconductor substrate, and the source region or drain region is respectively formed in the semiconductor substrate on two sides of the gate structure.

* * * * *